(12) United States Patent
Lind et al.

(10) Patent No.: US 9,180,522 B2
(45) Date of Patent: Nov. 10, 2015

(54) COATED CUTTING TOOL INSERT

(75) Inventors: Hans Lind, Linkoping (SE); Rikard Forsen, Linkoping (SE); Mats Johansson, Linkoping (SE); Ferenc Tasnadi, Linkoping (SE); Naureen Ghafoor, Linkoping (SE); Bjorn Alling, Linkoping (SE); Magnus Oden, Tullinge (SE); Igor Abrikossov, Linkoping (SE)

(73) Assignee: SECO TOOLS AB, Fagersta (SE)

( * ) Notice: Subject to any disclaimer, the term of this patent is extended or adjusted under 35 U.S.C. 154(b) by 190 days.

(21) Appl. No.: 13/989,139

(22) PCT Filed: Nov. 22, 2011

(86) PCT No.: PCT/EP2011/070685
§ 371 (c)(1),
(2), (4) Date: Jul. 17, 2013

(87) PCT Pub. No.: WO2012/069475
PCT Pub. Date: May 31, 2012

(65) Prior Publication Data
US 2013/0287507 A1    Oct. 31, 2013

(30) Foreign Application Priority Data
Nov. 23, 2010   (EP) ..................................... 10192235

(51) Int. Cl.
*B23B 27/14*    (2006.01)
*C23C 14/06*    (2006.01)
(Continued)

(52) U.S. Cl.
CPC ........... *B23B 27/148* (2013.01); *C23C 14/0021* (2013.01); *C23C 14/0641* (2013.01); *C23C 14/325* (2013.01); *C23C 28/00* (2013.01); *C23C 30/005* (2013.01); *Y10T 407/27* (2015.01)

(58) Field of Classification Search
USPC ............ 51/307, 309; 428/336, 469, 472, 697, 428/698, 699; 204/192, 192.1, 192.15, 204/192.16, 279
See application file for complete search history.

(56) References Cited

U.S. PATENT DOCUMENTS 6,730,392 B2 *   5/2004   Vetter et al. .................... 428/216
6,794,064 B2 *   9/2004   Vetter ........................... 428/697
(Continued)

FOREIGN PATENT DOCUMENTS

CN        101209611 A    7/2008
CN        100460114 C    2/2009
(Continued)

OTHER PUBLICATIONS

Chinese Office Action, dated Sep. 17, 2014, from corresponding CN reference.
(Continued)

*Primary Examiner* — Archene Turner
(74) *Attorney, Agent, or Firm* — Young & Thompson

(57) ABSTRACT

A cutting tool insert for machining by chip removal includes a body of a hard alloy of cemented carbide, cermet, ceramics, polycrystalline diamond or cubic boron nitride based materials onto which a hard and wear resistant coating is deposited by physical vapour deposition (PVD). The coating includes at least one layer of a NaCl-structured $(Ti_cAl_aCr_bMe_d)(C_zO_yN_x)$ where Me is one or more of the elements Zr, Hf, V, Nb, Ta, Mo, W and/or Si, $0.10<a<0.60$, $b+d>0.20$, $c>0.05$, $0\leq d<0.25$, $0.75<x<1.05$, $0\leq y<0.25$ and $0\leq z\leq 0.25$ with a thickness between 0.5 and 10 μm. The layer has a columnar microstructure with an average columnar width of <1 μm, a compressive stress level of $-6$ GPa$<\sigma<-0.5$ GPa and a nanohardness >25 GPa.

12 Claims, 2 Drawing Sheets

(51) Int. Cl.
  *C23C 14/00* (2006.01)
  *C23C 14/32* (2006.01)
  *C23C 28/00* (2006.01)
  *C23C 30/00* (2006.01)

(56) References Cited

U.S. PATENT DOCUMENTS

| | | | |
|---|---|---|---|
| 6,824,601 B2 * | 11/2004 | Yamamoto et al. | 428/699 |
| 7,541,101 B2 * | 6/2009 | Weber | 428/698 |
| 7,989,093 B2 | 8/2011 | Myrtveit | |
| 8,043,728 B2 * | 10/2011 | Yamamoto | 428/699 |
| 8,227,098 B2 | 7/2012 | Astrand | |
| 2001/0031347 A1 | 10/2001 | Vetter et al. | |
| 2003/0124391 A1 | 7/2003 | Vetter | |
| 2004/0237840 A1 | 12/2004 | Yamamoto | |
| 2006/0222891 A1 | 10/2006 | Weber | |

FOREIGN PATENT DOCUMENTS

| | | |
|---|---|---|
| CN | 101691654 A | 4/2010 |
| EP | 1 132 498 | 9/2001 |
| EP | 1219723 | 7/2002 |
| EP | 1947209 | 7/2008 |
| JP | 2000038653 | 2/2000 |
| JP | 2003-212999 | 7/2008 |
| JP | 2008-264971 | 11/2008 |

OTHER PUBLICATIONS

International Search Report dated Jan. 19, 2012, corresponding to PCT/EP2011/070685.

* cited by examiner

COATED CUTTING TOOL INSERT

BACKGROUND OF THE INVENTION

The present invention relates to a cutting tool insert comprising of a body of a hard alloy of cemented carbide, cermet, ceramics and cubic boron nitride based materials and a coating designed to be used in metal cutting applications generating high tool temperatures. Said coating comprises at least one thermally stable, textured (Ti,Al,Cr,Me) based nitride, carbonitride, oxynitride and/or oxycarbonitride layer, where Me is one or more of the elements: Zr, Hf, V, Nb, Ta, Mo, W or Si. The coating is grown by physical vapour deposition (PVD) and preferably by cathodic arc evaporation.

Since the mid 1980's, efforts have been made to improve the properties, e.g., wear resistance and hence the performance of tool coatings. At that time, the common practice was to coat cutting tools with TiN. However, TiN suffers from poor oxidation resistance. Improved heat resistance have been achieved by alloying Al in (Ti,Al)N. To further enhance the performance of tool coatings, a wide range of ternary and quaternary systems have been investigated, some with good and some with poor results. One of the most crucial parameter in this research is to achieve a good control of the solubility behavior of the alloying elements and in turn how this would yield an optimized coating performance. Recently, it has been shown that alloying Cr in (Ti,Al,Cr)N improves the coating behavior metal cutting applications.

JP 7237010 discloses a coated cutting tool at least one layer selected from (Ti,Al,Cr)C, (Ti,Al,Cr)N or (Ti,Al,Cr)(C,N) and at least one layer of Ti, TiC, TiN or TiCN.

JP 4128363 discloses a $(Ti_{1-x-y}Al_xCr_y)N$ layer where x<0.8 and 0.2<y<0.7.

JP 2000038653 discloses a $(Ti_{1-x-y}Cr_xAl_y)N$ layer where 0.02≤x<1.0 and 0.02≤y≤0.7.

EP 1219723 discloses a hard coating for cutting tools composed of $(Ti_{1-a-b-c-d}Al_aCr_bSi_cB_d)(C_{1-e}N_e)$ where 0.5≤a≤0.8, 0.06≤b, 0≤c≤0.1, 0≤d≤0.1, 0≤c+d≤0.1, a+b+c+d<1 and 0.5≤e≤1.

EP 1132498 discloses a hard wear resistance coating comprising one or two layers of $(Al_aTi_bCr_c)(N_wO_{1-w})$ where 30≤a≤70, 30≤b≤70, 0.5≤c≤20, a+b+c=1 0 0 and 0.7≤w≤0.9.

EP 1947209 discloses a first layer of $(Cr_{1-x}M_x)(B_aC_bN_{1-a-b})$ where 0≤x≤0.7, 0≤a≤0.2 and 0≤b≤0.5 and M is at least one of the elements W, V, Mo, Nb, Ti and Al and a second layer of $(Ti_{1-X-Y}Cr_XAl_YL_Z)(B_BC_AN_{1-A-B})$ where 0≤1-X-Y≤0.5, 0<X≤0.5, 0.4≤Y≤0.7, 0≤Z≤0.15, 0≤A≤0.5, and 0≤B≤0.2 and L is at least either of Si and Y.

As mentioned, the metal cutting industry is continuously looking for new hard coatings with improved high temperature wear resistance and is partly biased by the ongoing development of advanced work material as well as the need for an increased productivity. In turn, these aspects typically results in an increase of the tool temperature during a cutting operation. Hence, the problem to be solved by the present invention focuses on how to provide an alternative method for making a coated cutting tool insert, drill or endmill.

It is an object of the present invention to provide a coated cutting tool insert yielding improved performance in metal cutting applications at high tool temperatures.

Surprisingly, it has been found that by alloying Cr in (Ti, Al)N and adding small amounts of the metal elements Me: Zr, Hf, V, Nb, Ta, Mo, W and/or Si in a textured (Ti,Al,Cr,Me)(C,O,N) layer structure onto a cutting tool insert improves the tool life at machining operations generating high tool temperatures.

DETAILED DESCRIPTION OF THE INVENTION

Figure 1:
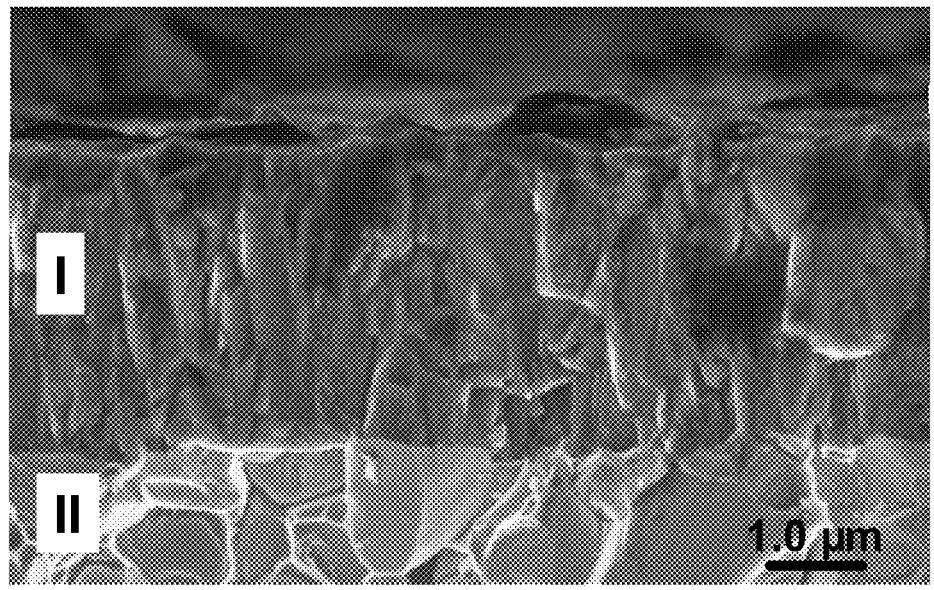
FIG. 1; SEM micrograph of a fractured cross section $(Ti_{0.17}Al_{0.53}Cr_{0.30})N$ layer, marked with I, on a cemented carbide insert, marked with II.

According to the present invention, there is provided a cutting tool insert for machining by chip removal comprising a body of a hard alloy of cemented carbide, cermet, ceramics, polycrystalline-diamond or cubic boron nitride based materials onto which is deposited a hard and wear resistant coating comprising at least one layer of a NaCl-structured $(Ti_{1-a-b}Cr_aMe_d)(C_zO_yN_x)$ with a thickness between 0.5 and 10 μm, preferably between 1.5 and 5 μm, where Me is one or more of the elements: Zr, Hf, V, Nb, Ta, Mo, W or Si, preferably Zr, Nb and Ta, and 0.10<a<0.60, preferably 0.25<a<0.55, most preferably 0.45<a<0.55, b+d>0.20, preferably b+d>0.25, most preferably b+d>0.35 c>0.05, preferably 0.05<c<b+d,

0≤d<0.25, 0.75<x<1.05, preferably 0.90<x<1.05,

0≤y<0.25, preferably 0≤y<0.15,

0≤z≤0.25, preferably 0≤z≤0.15.

Said layer has a fiber texture with texture coefficients, TC(hkl), according to:

TC(220)<TC(111),

TC(220)<TC(200) and 0.1<TC(111)/TC(200)<10, preferably 1<TC(111)/TC(200)<10, most preferably 4<TC(111)/TC(200)<10.

Due to the finite layer thickness, the corrected texture coefficients, TC(hkl), are deduced as:

$$TC(hkl) = TC_{meas}(hkl)\left[1 - e^{-\frac{2\mu x}{\sin\theta_{hkl}}}\right]^{-1}$$

where $TC_{meas}$(hkl) is the measured texture coefficient for a given (hkl) reflection, μ (μm$^{-1}$) is the linear absorption coefficient, x (μm) is the layer thickness and $\theta_{hkl}$ is half the diffraction angle for the same (hkl) reflection.

For said layers, μ vary between 0.053 and 0.11 μm$^{-1}$ using CuKα radiation. μ increases with an increasing Cr content of the layers. In average, μ=0.0815 μm$^{-1}$ is used in the TC(hkl) calculations which also is the close to the value for $(Ti_{0.17}Al_{0.53}Cr_{0.30})N$ with μ=0.08201.

$TC_{meas}(hkl)$ is determined from X-ray diffraction data in a θ-2θ configuration as:

$$TC_{meas}(hkl) = \frac{I_{meas}(hkl)}{I_0(hkl)} \left[ \frac{1}{n} \sum_{n=1}^{n} \frac{I_{meas}(hkl)}{I_0(hkl)} \right]^{-1}$$

where $I_{meas}(hkl)$ is the intensity of the (hkl) reflection, $I_o(hkl)$ is the standard intensity for the same (hkl) reflection where $I_o(111)=72$, $I_o(200)=100$ and $I_o(220)=45$, respectively, and n=3, i.e., the number of (hkl) reflections used in the calculations. Here, only the first order reflections (hkl) are used, i.e., (111), (200) and (220), respectively.

Said layer has a columnar microstructure with an average column width of <1 μam, preferably <0.6 μm, as determined by cross sectional transmission electron microscopy of a middle region of the layer, i.e., a region within 30 to 70% of the layer thickness in the growth direction, and said average columnar width is the average of at least 10 adjacent columns.

Said layer has a compressive stress level $-6.0<\sigma<-0.5$ GPa, preferably $-4.0<\sigma<-1.5$ GPa. The residual stress is evaluated by XRD using the $\sin^2\psi$ method with a Poisson's ratio of v=0.23 and a Young's modulus of E=379 GPa.

Said layer has a nanohardness >25 GPa, preferably between 25 GPa and 40 GPa, as measured by nanoindentation experiments.

In one preferred embodiment, d=y=z=0.
In another preferred embodiment, y=z=0.
In yet another preferred embodiment, d=y=0.
In yet another preferred embodiment, y=0.
In yet another preferred embodiment, d=z=0.
In yet another preferred embodiment, z=0.
In yet another embodiment y=z=0 and Me=Zr.
In yet another embodiment y=z=0 and Me=Nb.
In yet another embodiment y=z=0 and Me=Ta.
In yet another embodiment y=0 and Me=Zr.
In yet another embodiment y=0 and Me=Nb.
In yet another embodiment y=0 and Me=Ta.
In yet another embodiment z=0 and Me=Zr.
In yet another embodiment z=0 and Me=Nb.
In yet another embodiment z=0 and Me=Ta.

Said layer may comprise an inner single- and/or laminated coating structure of, e.g., TiN, TiC, Ti(C,N) or (Ti,Al)N, preferably TiN or (Ti,Al)N, and/or an outer single- and/or laminated coating structure of, e.g., TiN, TiC, Ti(C,N), (Ti,Al)N or oxides, preferably TiN or (Ti,Al)N, to a total thickness of 0.7 to 20 μm, preferably 2 to 10 μm, and most preferably 2 to 7 μm, according to prior art.

The deposition method for the layers of the present invention is based on PVD techniques, e.g., cathodic arc evaporation or magnetron sputtering using one or more pure and/or alloyed metal $(Ti_cAl_aCr_bMe_d)$ cathodes/targets.

In the case of cathodic arc evaporation, the layers according to the invention are grown with an evaporation current between 50 and 200 A depending on the cathode size. A higher evaporation current is needed for larger cathodes in order to achieve comparable deposition conditions. The layers are grown using one or more pure, composite and/or alloyed metal cathodes, where Me is one or more of the elements: Zr, Hf, V, Nb, Ta, Mo, W or Si, in a reactive atmosphere containing $N_2$ and optionally $O_2$ and/or C-containing gases, with or without a carrier gas such as, e.g. Ar, at a total gas pressure between 1.0 and 7.0 Pa, preferably between 1.5 and 4.0 Pa. The C-containing gas may, e.g., be selected from $CH_4$ and/or $C_2H_2$. The desired layer composition is obtained by selecting adequate $(Ti_cAl_aCr_bMe_d)$ cathode compositions and gas atmosphere. The negative substrate bias is between 0 and 300 V, preferably between 10 and 150 V, most preferably between 15 and 60 V. The deposition temperature is between 200 and 800° C., preferably between 300 and 600° C.

In the case of magnetron sputtering, the layers according to the invention are grown with a power density applied to the sputter target between 0.5 and 15 W/cm², preferably between 1 and 5 W/cm². The layers are grown using one or more pure, composite and/or alloyed metal cathodes, where Me is one or more of the elements: Zr, Hf, V, Nb, Ta, Mo, W or Si, in a reactive atmosphere containing $N_2$ and optionally $O_2$ and/or C-containing gases, with or without a carrier gas such as, e.g. Ar, at a total pressure between 0.13 and 7.0 Pa, preferably between 0.13 and 2.5 Pa. The C-containing gas may, e.g., be selected from $CH_4$ and/or $C_2H_2$. The desired layer composition is obtained by selecting adequate $(Ti_cAl_aCr_bMe_d)$ cathode compositions and gas atmosphere. The negative substrate bias is between 0 and 300 V, preferably between 10 and 150 V, most preferably between 20 and 100 V. The deposition temperature is between 200 and 800° C., preferably between 300 and 600° C.

The invention also relates to the use of cutting tool insert according to the above for metal machining generating high temperatures, e.g., super alloys and hardened steel at cutting speeds of 50-500 m/min, preferably 50-300 m/min, with an average feed of 0.08-0.5 mm/rev, preferably 0.1-0.4 mm/rev, depending on cutting speed and insert geometry.

The present invention has been described with reference to a cutting tool insert but it is evident that it also can be applied to other metal cutting tools, e.g., drills and endmills.

EXAMPLE 1

Cemented carbide inserts with composition 90 wt % WC–10 wt % Co (fine grain size, Hc=20.5 kA/m) were used.

Before deposition, the inserts were cleaned according to standard practice. The system was evacuated to a pressure of less than 0.08 Pa, after which the inserts were sputter cleaned with Ar ions. $(Ti_cAl_aCr_b)N_y$ layers were grown by cathodic arc evaporation using alloyed (Ti,Al,Cr) cathodes, resulting in the desired layer compositions as shown in Table 1. The layers were grown at 400° C., in pure $N_2$ atmosphere at a total pressure of 2.5 Pa, using a substrate bias of −40 V and an evaporation current of 75 A to a total thickness of about 3.0 μm.

TABLE 1

| | Layer composition (at %) | | | | | | | |
|---|---|---|---|---|---|---|---|---|
| Sample | Ti | Al | Cr | N | TC(111) | TC(200) | TC(220) | TC(111)/TC(200) |
| 1 | 0.63 | 0.16 | 0.23 | 1.02 | 1.23 | 0.64 | 0.09 | 1.92 |
| 2 | 0.41 | 0.11 | 0.48 | 1.00 | 1.05 | 0.58 | 0.09 | 1.81 |
| 3 | 0.09 | 0.08 | 0.83 | 0.94 | 1.20 | 0.50 | 0.05 | 2.40 |

TABLE 1-continued

| | Layer composition (at %) | | | | | | | |
|---|---|---|---|---|---|---|---|---|
| Sample | Ti | Al | Cr | N | TC(111) | TC(200) | TC(220) | TC(111)/TC(200) |
| 4 | 0.24 | 0.21 | 0.55 | 0.96 | 2.43 | 0.62 | 0.13 | 3.93 |
| 5 | 0.37 | 0.25 | 0.38 | 0.97 | 2.21 | 0.57 | 0.11 | 3.89 |
| 6 | 0.49 | 0.24 | 0.29 | 1.02 | 2.01 | 0.60 | 0.08 | 3.35 |
| 7 | 0.09 | 0.23 | 0.68 | 1.00 | 1.95 | 0.56 | 0.08 | 3.48 |
| 8 | 0.75 | 0.25 | 0.00 | 0.98 | — | — | — | — |
| 9 | 0.01 | 0.29 | 0.67 | 0.97 | — | — | — | — |
| 10 | 0.46 | 0.33 | 0.22 | 0.97 | 2.12 | 0.60 | 0.06 | 3.53 |
| 11 | 0.32 | 0.34 | 0.34 | 0.92 | 2.10 | 0.56 | 0.07 | 3.75 |
| 12 | 0.16 | 0.33 | 0.51 | 0.98 | 2.14 | 0.57 | 0.12 | 3.76 |
| 13 | 0.49 | 0.48 | 0.06 | 1.03 | 0.51 | 2.44 | 0.30 | 0.21 |
| 14 | 0.24 | 0.46 | 0.30 | 1.00 | 2.48 | 0.43 | 0.09 | 5.83 |
| 15 | 0.15 | 0.46 | 0.38 | 0.95 | 2.29 | 0.28 | 0.09 | 8.18 |
| 16 | 0.31 | 0.46 | 0.23 | 0.97 | 2.10 | 0.55 | 0.15 | 3.82 |
| 17 | 0.08 | 0.47 | 0.45 | 0.96 | 2.13 | 0.42 | 0.10 | 5.06 |
| 18 | 0.38 | 0.47 | 0.15 | 0.97 | 0.37 | 2.52 | 0.25 | 0.15 |
| 19 | 0.02 | 0.50 | 0.49 | 1.01 | 2.38 | 0.35 | 0.13 | 6.80 |
| 20 | 0.50 | 0.50 | 0.05 | 1.05 | — | — | — | — |
| 21 | 0.27 | 0.52 | 0.24 | 1.03 | 1.95 | 0.52 | 0.07 | 3.75 |
| 22 | 0.08 | 0.53 | 0.39 | 0.95 | 2.13 | 0.25 | 0.07 | 8.37 |
| 23 | 0.17 | 0.53 | 0.30 | 0.94 | 2.19 | 0.44 | 0.13 | 4.98 |
| 24 | 0.24 | 0.54 | 0.23 | 1.00 | 2.10 | 0.45 | 0.08 | 4.67 |
| 25 | 0.17 | 0.55 | 0.28 | 0.97 | 2.02 | 0.50 | 0.14 | 4.05 |
| 26 | 0.08 | 0.57 | 0.37 | 1.02 | 2.14 | 0.42 | 0.15 | 5.11 |
| 27 | 0.13 | 0.56 | 0.31 | 1.00 | 2.17 | 0.54 | 0.11 | 4.01 |
| 28 | 0.20 | 0.58 | 0.22 | 0.96 | 2.15 | 0.49 | 0.12 | 4.39 |
| 29 | 0.04 | 0.60 | 0.36 | 0.93 | 2.08 | 0.42 | 0.08 | 5.00 |
| 30 | 0.27 | 0.63 | 0.10 | 0.97 | 0.41 | 2.26 | 0.33 | 0.18 |
| 31 | 0.26 | 0.74 | 0.03 | 1.03 | — | — | — | — |
| 32 | 0.00 | 0.73 | 0.27 | 0.95 | — | — | — | — |

The as-deposited layers were characterized with respect to composition, microstructure and hardness by scanning electron microscopy (SEM), transmission electron microscopy (TEM), X-ray diffraction (XRD) and nanoindentation, respectively.

The average composition of the layers was estimated by energy dispersive spectroscopy (EDS) analysis area using a LEO Ultra 55 scanning electron microscope operated at 10 kV equipped with a Thermo Noran EDS. Industrial standards and ZAF correction were used for the quantitative analysis. The metal composition was evaluated using a Noran System Six (NSS ver 2) software (see Table 1).

Figure 2:
FIG. 2; TEM micrograph of a $(Ti_{0.17}Al_{0.53}Cr_{0.30})N$ layer in cross section. The image is obtained close to the middle of the layer thickness. The growth direction is marked with an arrow.

All layers exhibited a columnar microstructure. FIG. 1 is a SEM micrograph of sample #23 in Table 1 showing a fractured cross section of the $(Ti_{0.17}Al_{0.53}Cr_{0.30})N$ layer, marked as I, and the cemented carbide insert, marked as II. In addition to SEM, further details of the mictrostructure were obtained by cross-sectional TEM using a FEI Technai $G^2$ TF 20 UT operated at 200 kV. Samples for TEM were prepared by conventional mechanical grinding/polishing followed by ion-beam etching to electron translucency of the samples. FIG. 2 shows a TEM micrograph of the $(Ti_{0.17}Al_{0.53}Cr_{0.30})N$ layer in cross section. The image is obtained close to the middle of the layer thickness and the growth direction is marked with an arrow. Said layer has a columnar microstructure with an average columnar width of about 0.5 μm. The average column width was determined by averaging the width of more than 10 adjacent columns.

Figure 3:
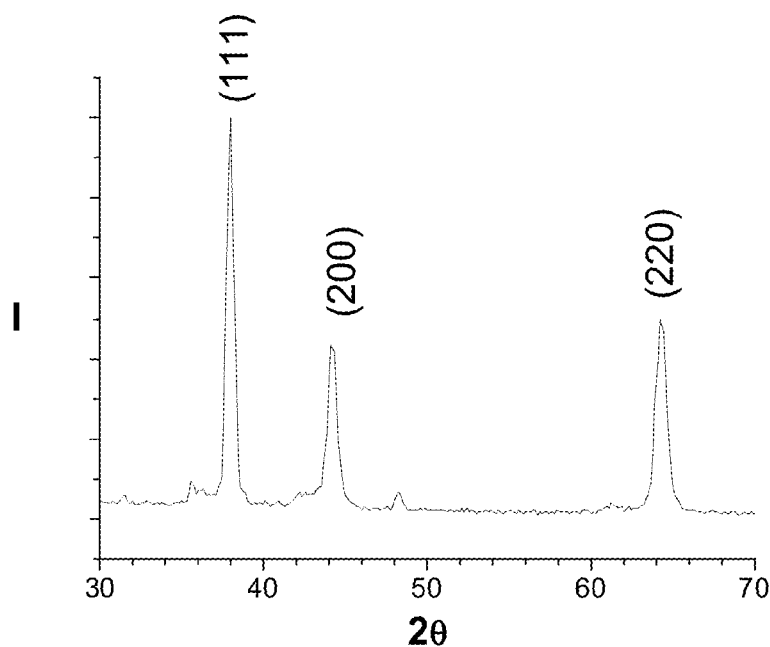
FIG. 3; Grazing incidence X-ray diffraction patterns of a $(Ti_{0.17}Al_{0.53}Cr_{0.30})N$ layer obtained with an incidence angle of 1°. The diffraction peaks are indexed as a NaCl-structure.
Figure 4:
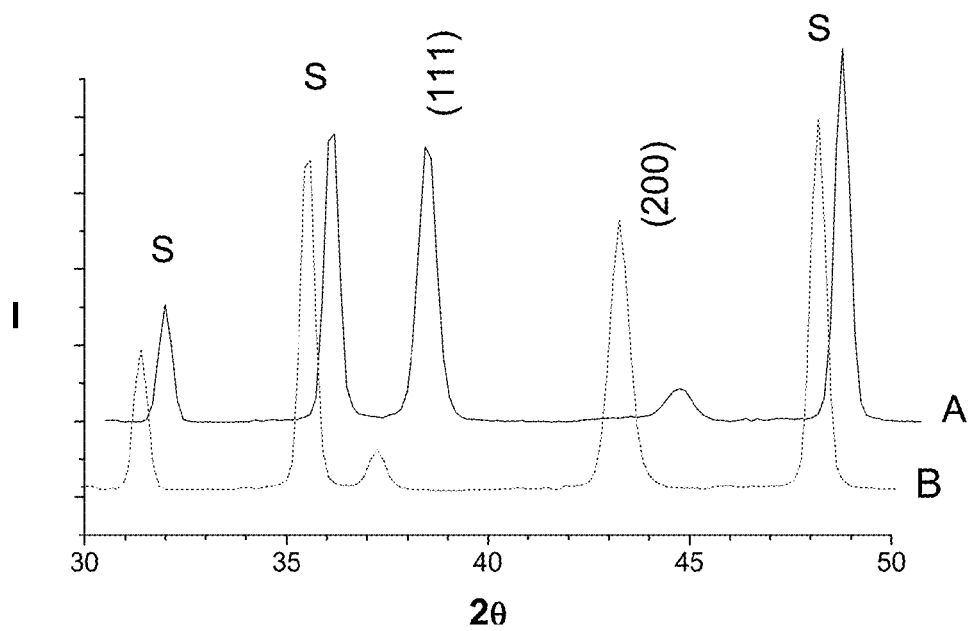
FIG. 4; X-ray diffraction patterns of (Ti,Al,Cr)N layers with (A) a layer with {111} fiber texture having a Cr content of 30 at % and (B) a layer with {200} fiber textured having a Cr content of 10 at %.

The NaCl-structure of the layers was confirmed by XRD in both θ-2θ and grazing incidence (GI) configuration. XRD patterns were obtained using a Bruker AXS D8-advanced x-ray diffractometer with Cu $K_\alpha$ radiation. FIG. 3 shows the GI pattern, 1° incidence angle, of sample #23 from which the NaCl layer structure is verified. The XRD data was also used to determine the texture relations of the samples. FIG. 4 shows XRD patterns of sample #14, marked as A, with texture coefficients TC(111)=2.48, TC(200)=0.43 and TC(220)=0.09, i.e., having a {111} fiber texture and sample #30, marked as B, with texture coefficients TC(111)=0.41, TC(200)=2.26 and TC(220)=0.33, i.e., having a {200} fiber texture.

The residual stresses, a, of the (Ti,Al,Cr)N layers were evaluated by XRD measurements using the $\sin^2\psi$ method. The stress measurements were obtained using the 220-reflection. Data was obtained using the side-inclination technique (Ψ-geometry) with 11, Ψ-angles (positive and negative), equidistant within a $\sin^2\Psi$ range of 0 to 0.82 (Ψ~65°). The residual stress values were evaluated using a Poisson's ratio of ν=0.23 and Young's modulus of E=379 GPa.

Finally, hardness data was estimated by the nanoindentation technique. Indentations were performed on mechanically polished layers using a UMIS nanoindentation system with a Berkovich diamond tip and a maximum tip load of 30 mN. Hardness data was evaluated from the load-off segment using the UMIS software.

EXAMPLE 2

Example 1 was repeated but using alloyed (Ti,Al,Cr,Me) cathodes, resulting in the desired (Ti,Al,Cr,Me)N, balanced in N content, layer compositions as shown in Table 2 for Me=Zr, Table 3 for Me=Nb and Table 4 for Me=Ta, respectively.

TABLE 2

| | Layer composition (at %) | | | |
|---|---|---|---|---|
| Sample | Ti | Al | Cr | Zr |
| 1 | 0.14 | 0.62 | 0.19 | 0.05 |
| 2 | 0.26 | 0.54 | 0.13 | 0.07 |
| 3 | 0.29 | 0.50 | 0.18 | 0.03 |

TABLE 2-continued

| | Layer composition (at %) | | | |
|---|---|---|---|---|
| Sample | Ti | Al | Cr | Zr |
| 4 | 0.45 | 0.35 | 0.13 | 0.07 |
| 5 | 0.39 | 0.31 | 0.12 | 0.18 |
| 6 | 0.22 | 0.46 | 0.24 | 0.08 |
| 7 | 0.10 | 0.50 | 0.29 | 0.11 |
| 8 | 0.13 | 0.60 | 0.23 | 0.04 |
| 9 | 0.11 | 0.48 | 0.25 | 0.16 |
| 10 | 0.12 | 0.33 | 0.46 | 0.09 |
| 11 | 0.22 | 0.36 | 0.27 | 0.15 |

TABLE 3

| | Layer composition (at %) | | | |
|---|---|---|---|---|
| Sample | Ti | Al | Cr | Nb |
| 1 | 0.22 | 0.55 | 0.18 | 0.05 |
| 2 | 0.13 | 0.48 | 0.27 | 0.12 |
| 3 | 0.20 | 0.38 | 0.27 | 0.15 |

TABLE 4

| | Layer composition (at %) | | | |
|---|---|---|---|---|
| Sample | Ti | Al | Cr | Ta |
| 1 | 0.11 | 0.60 | 0.24 | 0.05 |
| 2 | 0.15 | 0.48 | 0.27 | 0.10 |
| 3 | 0.20 | 0.36 | 0.29 | 0.15 |

EXAMPLE 3

Example 1 was repeated but using an alloyed ($Ti_{0.33}Al_{0.33}Cr_{0.34}$) cathode for growth of samples 1-4 in, an alloyed ($Ti_{0.25}Al_{0.45}Cr_{0.30}$) cathode for growth of samples 5-8 and an alloyed ($Ti_{0.15}Al_{0.55}Cr_{0.30}$) cathode for growth of samples 9-12 in Table 6, respectively. Said layers were grown in a mixed reactive $N_2+O_2+CH_4$ gas mixture at a total gas pressure of 2.5 Pa. The partial pressures of $N_2$, $O_2$ and $CH_4$ were individually set to yield the desired layer composition as shown in Table 5.

TABLE 5

| | Layer composition (at %) | | | | | |
|---|---|---|---|---|---|---|
| Sample | Ti | Al | Cr | C | O | N |
| 1 | 0.32 | 0.34 | 0.34 | 0.06 | 0.45 | 0.49 |
| 2 | 0.32 | 0.34 | 0.34 | 0.13 | 0.25 | 0.62 |
| 3 | 0.32 | 0.34 | 0.34 | 0.07 | 0.12 | 0.81 |
| 4 | 0.32 | 0.34 | 0.34 | 0.10 | 0.00 | 0.90 |
| 5 | 0.24 | 0.46 | 0.30 | 0.06 | 0.45 | 0.49 |
| 6 | 0.24 | 0.46 | 0.30 | 0.13 | 0.25 | 0.62 |
| 7 | 0.24 | 0.46 | 0.30 | 0.07 | 0.12 | 0.81 |
| 8 | 0.24 | 0.46 | 0.30 | 0.10 | 0.00 | 0.90 |
| 9 | 0.13 | 0.56 | 0.31 | 0.06 | 0.45 | 0.49 |
| 10 | 0.13 | 0.56 | 0.31 | 0.13 | 0.25 | 0.62 |
| 11 | 0.13 | 0.56 | 0.31 | 0.07 | 0.12 | 0.81 |
| 12 | 0.13 | 0.56 | 0.31 | 0.10 | 0.00 | 0.90 |

EXAMPLE 4

Samples 2, 4, 10, 13, 14, 22, 23, 25 and 30 from example 1 were tested and compared to competitor grades under the following conditions:
Geometry: DCMT11T304-F1
Application: Longitudinal turning
Work piece material: DIN 100Cr6
Cutting speed: 250 m/min
Feed: 0.15 mm/rev
Depth of cut: $a_p$=0.5 mm
Tool life criteria: Flank wear (vb)>0.2 mm
The results are presented in Table 6.

TABLE 6

| Sample | Life time (min) |
|---|---|
| 2 | 20 |
| 4 | 22 |
| 10 | 22 |
| 13 | 19 |
| 14 | 24.5 |
| 22 | 25 |
| 23 | 23 |
| 25 | 22 |
| 30 | 21 |
| Competitor grade A | 20 |
| Competitor grade B | Failure |
| Competitor grade C | 19 |

The test was stopped at the same maximum flank wear. An improved tool performance with improved wear characteristics scales with an increase in TC(111)/TC(200).

EXAMPLE 5

Samples 2, 4, 10, 13, 14, 22, 23, 25 and 30 from example 1 were tested and compared to competitor grades under the following conditions:
Geometry: XOEX120408-M07
Application: Shoulder milling
Cutter diameter: 32 mm
Work piece material: SS1672
Cutting speed: 275 m/min
Feed: 0.25 mm/tooth
Depth of cut: $a_p$=3 mm
Width of cut: 8.8 mm
Tool life criteria: Flank wear (vb)>0.3 mm
The results are presented in Table 7.

TABLE 7

| Sample | Life time (min) |
|---|---|
| 2 | 7.5 |
| 4 | 8 |
| 10 | 7.5 |
| 13 | 8 |
| 14 | 9.5 |
| 22 | 10.3 |
| 23 | 9 |
| 25 | 8.5 |
| 30 | 7 |
| Competitor grade D | 6 |
| Competitor grade E | 7 (chipping) |
| Competitor grade F | 6 |

The test was stopped at the same maximum flank wear. An improved tool performance with improved wear characteristics scales with an increase in TC(111)/TC(200).

The invention claimed is:
1. A cutting tool insert for machining by chip removal comprising a body based on a material selected from the group consisting of a hard alloy of cemented carbide, cermet, ceramics, polycrystalline-diamond and cubic boron nitride;

and a hard and wear resistant coating deposited onto said body, said hard and wear resistant coating comprising least one layer, wherein said layer is a columnar NaCl-structured $(Ti_cAl_aCr_bMe_d)(C_zO_yN_x)$ with a thickness between 1.5 and 10 µm, a compressive stress level of −6 GPa<σ<−0.5 GPa, a nanohardness >25 GPa with an average columnar width of <1µm and where Me is one or more of the elements: Zr, V, Nb, Ta, Mo, or W and 0.45<a<0.55
b+d>0.20,
0.05<c<b+d,
0≤d<0.25,
0.75<x<1.05,
0≤y<0.25, and
0≤z≤0.25.

2. The cutting tool insert according to claim 1, wherein Me is one or more of the elements Zr, Nb and Ta.

3. The cutting tool insert according to claim 1, wherein b+d>0.25.

4. The cutting tool insert according to claim 1, wherein 0.90<x<1.05.

5. The cutting tool insert according to claim 1, wherein said layer is textured with TC(220)<TC(111),
TC(220)<TC(200) and
0.1<TC(111)/TC(200)<10, where the TC(hkl) is the corrected texture coefficient for the (hkl) reflection and calculated as:

$$TC(hkl) = TC_{meas}(hkl)\left[1 - e^{-\frac{2\mu x}{\sin\theta_{hkl}}}\right]^{-1}$$

where
µ (µm$^{-1}$) is the linear absorption coefficient that in average is µ=0.0815 µm$^{-1}$ for said layers, x (µm) is the layer thickness, $\theta_{hkl}$ is half the diffraction angle for (hkl) reflection and $TC_{meas}$(hkl) is the measured texture coefficient using XRD data in a θ−2θ configuration according to:

$$TC_{meas}(hkl) = \frac{I_{meas}(hkl)}{I_0(hkl)}\left[\frac{1}{n}\sum_{n=1}^{n}\frac{I_{meas}(hkl)}{I_0(hkl)}\right]^{-1}$$

where
$I_{meas}$(hkl) is the intensity of the (hkl) reflection, $I_o$(hkl) is the standard intensity for the same (hkl) reflection, and n is the number of (hkl) reflections, and
for reflections (111), (200) and (220), $I_o$(111)=72, $I_o$(200)=100 and $I_o$(220)=45, respectively, and n=3.

6. The cutting tool insert according to claim 5, wherein 1<TC(111)/TC(200)<10.

7. The cutting tool insert according to claim 1, wherein d=y=z=0.

8. The cutting tool insert according to claim 1, wherein y=z=0.

9. The cutting tool insert according to claim 1, wherein y=z=0 and Me=Zr.

10. The cutting tool insert according to claim 1, wherein said layer further comprises an inner single-coating or laminated coating structure of TiN, TiC, Ti(C,N) or (Ti,Al)N, and/or an outer single-coating or laminated coating structure of TiN, TiC, Ti(C,N), (Ti,Al)N or oxides, to a total thickness of 0.7 to 20µm.

11. A method of making a cutting tool insert according to claim 1, comprising growing said layer by cathodic arc evaporation using a composite or alloyed $Ti_cAl_aCr_bMe_d$ cathode, where Me is one or more of the elements: Zr, V, Nb, Ta, Mo, or W, in a reactive atmosphere at a total gas pressure between 1.0 and 7.0 Pa, with cathode composition and gas atmosphere yielding the desired layer composition, an evaporation current between 50 and 200 A, a negative substrate bias between 0 and 300 V, and a deposition temperature between 200 and 800° CU, wherein the reactive atmosphere contains a gas or gases selected from the group consisting of: $N_2$; $N_2$ and $O_2$; $N_2$ and C-containing gases; and $N_2$, $O_2$, and C-containing gases, and the reactive atmosphere optionally contains a carrier gas.

12. The cutting tool insert according to claim 2, wherein b+d>0.25.

* * * * *